United States Patent
Ikeda et al.

(10) Patent No.: US 9,200,777 B2
(45) Date of Patent: Dec. 1, 2015

(54) OPTICAL ELEMENT AND ILLUMINATION DEVICE USING THE SAME

(71) Applicant: NALUX CO., LTD., Osaka-shi, Osaka (JP)

(72) Inventors: Katsumoto Ikeda, Osaka (JP); Daisuke Seki, Osaka (JP)

(73) Assignee: NALUX CO., LTD., Osaka (JP)

(*) Notice: Subject to any disclaimer, the term of this patent is extended or adjusted under 35 U.S.C. 154(b) by 181 days.

(21) Appl. No.: 13/670,763

(22) Filed: Nov. 7, 2012

(65) Prior Publication Data
US 2013/0063952 A1  Mar. 14, 2013

Related U.S. Application Data

(63) Continuation-in-part of application No. PCT/JP2011/003608, filed on Jun. 23, 2011.

(60) Provisional application No. 61/418,579, filed on Dec. 1, 2010.

(51) Int. Cl.
*F21V 5/00* (2015.01)
*F21V 5/04* (2006.01)
(Continued)

(52) U.S. Cl.
CPC . *F21V 5/04* (2013.01); *F21V 5/046* (2013.01); *G02B 19/0014* (2013.01);
(Continued)

(58) Field of Classification Search
CPC ............. F21S 9/03; F21S 9/035; F21S 9/037; F21V 5/04; F21V 5/045; F21V 3/02; F21V 15/01; G02B 19/0014; G02B 19/0009; G02B 19/00; G02B 2003/0093; G02B 3/04
USPC ................. 362/311.01–311.15, 326, 333–335
See application file for complete search history.

(56) References Cited

U.S. PATENT DOCUMENTS 7,572,036 B2  8/2009  Yoon et al.
7,798,679 B2  9/2010  Kokubo et al.
(Continued)

FOREIGN PATENT DOCUMENTS

DE  102009017946 A1 * 10/2010  ............. G02B 27/00
EP  1 653 254 A2  5/2006
(Continued)

OTHER PUBLICATIONS

International Search Report and Written Opinion dated Oct. 4, 2011 corresponding to International Patent Application No. PCT/JP2011/003608.

*Primary Examiner* — Diane Lee
*Assistant Examiner* — Gerald J Sufleta, II
(74) *Attorney, Agent, or Firm* — Squire Patton Boggs (US) LLP

(57) ABSTRACT

An illumination device for planar light sources gives uniform illumination on an illuminated plane. A of lengthwise direction and length of breadthwise direction are different from each other. The illumination device includes a planar light source and an optical element including a light receiving surface for receiving light form the planar light source and a light exiting surface. A shape of the planar light source is symmetric with respect to x-axis and y-axis and a length of the shape in x-axis direction is shorter than length of the shape in y-axis direction; the center of the planar light source is set as the origin and two axes orthogonal to each other are selected as x-axis and y-axis. Assuming that the maximum value of x-coordinate of the planar light source is a and the maximum value of y-coordinate of the planar light source is b, the following relationships hold:

$$h_{ab} = \frac{(h_a + a) - (h_b + b)}{(h_a + a)}$$

$h_{ab} \leq 0.02$.

7 Claims, 14 Drawing Sheets

(51) Int. Cl.
  *G02F 1/1335* (2006.01)
  *G02B 19/00* (2006.01)
  *F21Y 101/02* (2006.01)
  *F21Y 105/00* (2006.01)
  *H01L 33/58* (2010.01)

(52) U.S. Cl.
  CPC ......... *G02B 19/0066* (2013.01); *G02F 1/1335* (2013.01); *F21Y 2101/02* (2013.01); *F21Y 2105/001* (2013.01); *H01L 33/58* (2013.01)

(56) References Cited

U.S. PATENT DOCUMENTS

| | | |
|---|---|---|
| 7,963,680 B2 | 6/2011 | Yoon et al. |
| 8,696,175 B2 | 4/2014 | Yoon et al. |
| 2004/0012951 A1* | 1/2004 | Pylkki et al. .................. 362/152 |
| 2006/0083000 A1 | 4/2006 | Yoon et al. |
| 2008/0158525 A1 | 7/2008 | Fujiyo et al. |
| 2009/0052192 A1 | 2/2009 | Kokubo et al. |
| 2009/0207602 A1* | 8/2009 | Reed et al. .................. 362/225 |
| 2009/0279312 A1 | 11/2009 | Yoon et al. |
| 2011/0164426 A1* | 7/2011 | Lee ............................... 362/335 |
| 2011/0242820 A1 | 10/2011 | Yoon et al. |
| 2014/0043831 A1 | 2/2014 | Yoon et al. |

FOREIGN PATENT DOCUMENTS

| | | |
|---|---|---|
| EP | 2 023 038 A2 | 2/2009 |
| JP | 3875247 B2 | 11/2006 |
| JP | 2008-164957 A | 7/2008 |
| JP | 2009-099604 A | 5/2009 |
| JP | 3153647 U | 9/2009 |
| JP | 2010-212083 A | 9/2010 |
| KR | 10-2006-0034021 A | 4/2006 |
| KR | 10-0977336 B1 | 8/2010 |

* cited by examiner

OPTICAL ELEMENT AND ILLUMINATION DEVICE USING THE SAME

CROSS REFERENCE TO RELATED APPLICATIONS

This application is a continuation-in-part of International Patent Application No. PCT/JP2011/003608 filed Jun. 23, 2011 which claims priority from U.S. Provisional Patent Application No. 61/418,579 filed Dec. 1, 2010. The contents of this application is hereby incorporated by reference.

BACKGROUND

1. Field

The present invention relates to an optical element used for planar light sources and an illumination device using the optical element.

2. Description of the Related Art

Illumination devices using planar light sources such as light emitting diodes (LED) are widely utilized. Backlight units with LEDs for displays are required to illuminate the display uniformly. Compared with incandescence lamp light sources, in LED light sources a greater amount of light to the total amount of light emitted by the light sources travels to the front. Accordingly, in order to illuminate a large area uniformly with LED light sources, the number of the LED light sources should be increased in such a way that light beams emitted by the LED light sources largely overlap one another, or the illuminated area should be located away from the LED light sources. However, if the number of the LED light sources is increased, the manufacturing cost as well as power consumption will increase. If the illuminated area is located away from the LED light sources, the illumination device cannot be made compact in size. Under the situation, a backlight unit in which optical elements are arranged in front of LED light sources in such a way that a distribution of light emitted by each of the LED light sources (a distribution of luminous intensity) is appropriately changed has been developed (see, for example, JP3875247).

An LED light source for large quantity of light often includes a plurality of LED chips. In this case, the plurality of LED chips is often arranged in a line to suit the convenience of electrical wiring or other structural requirements. As a result, length of lengthwise direction and length of breadthwise direction of the LED light source are different from each other. Further, in some LED light sources which include a single LED chip, length of lengthwise direction and length of breadthwise direction of the LED light source are different from each other because of electrical wiring or other requirements.

However, an illumination device used for planar light sources which gives uniform illumination on an illuminated plane and in which length of lengthwise direction and length of breadthwise direction are different from each other, has not been developed.

SUMMARY

There is a need for an illumination device used for planar light sources which gives uniform illumination on an illuminated plane and in which length of lengthwise direction and length of breadthwise direction are different from each other. An illumination device according to an embodiment of the present invention can include a planar light source and an optical element including a light receiving surface for receiving light form the planar light source and a light exiting surface. A shape of the planar light source in a plane is symmetric with respect to x-axis and y-axis and length of the shape in x-axis direction is shorter than length of the shape in y-axis direction where the center of the planar light source is set as the origin and two axes orthogonal to each other are selected as x-axis and y-axis. The axis which passes through the origin and is perpendicular to the plane is selected as an optical axis, and the light receiving surface is of a form like a cap, the top of the cap being at the point of intersection between the light receiving surface and the optical axis and any cross section of the cap containing the optical axis being symmetric with respect to the optical axis. Assuming that the maximum value of x-coordinate of the planar light source is a, the maximum value of y-coordinate of the planar light source is b and $$h_{ab} = \frac{(h_a + a) - (h_b + b)}{(h_a + a)},$$

the following relationship holds.

$$h_{ab} \leq 0.02$$

In certain embodiments of the illumination device according to the present invention, the light receiving surface is of a form like a cap, the top of the cap being at the point of intersection between the light receiving surface and the optical axis and any cross section of the cap containing the optical axis being symmetric with respect to the optical axis. Assuming that the maximum value of x-coordinate of the planar light source is a, the maximum value of y-coordinate of the planar light source is b and $$h_{ab} = \frac{(h_a + a) - (h_b + b)}{(h_a + a)},$$

the illumination device is shaped in such a way that the following relationship holds.

$$h_{ab} \leq 0.02$$

Accordingly, even for a planar light source in which length of x-axis direction is shorter than length in y-axis direction, unevenness of illuminance on an illuminated area in directions along both axes can be reduced.

In an illumination device according to a first embodiment of the present invention, the following relationship holds.

$$b/a \geq 1.2$$

In the present embodiment, even for a planar light source in which length of x-axis direction is shorter than length in y-axis direction, and the relationship $$b/a \geq 1.2$$

is held unevenness of illuminance on an illuminated area in directions along both axes can be reduced.

In an illumination device according to a second embodiment of the present invention, the light receiving surface is biconic.

According to the present embodiment, a shape of the illumination device which satisfies desired conditions can be easily determined.

In an illumination device according to a third embodiment of the present invention, the light receiving surface is represented by $$z = \sum_{i=0}\sum_{j=0} A_{ij} x^i y^j$$

where i and j represent integers.

According to the present embodiment, a shape of the illumination device which satisfies desired conditions can be easily determined.

In an illumination device according to a fourth embodiment of the present invention, the center of the light exiting surface is defined as the point of intersection of the light exiting surface and z-axis, and a diffusion member is provided around the center of the light exiting surface.

According to the present embodiment, unevenness of illuminance on an illuminated area in directions along both axes can be further reduced by diffusing light which travels toward the front along the optical axis.

In an illumination device according to a fifth embodiment of the present invention, the center of the light receiving surface is defined as the point of intersection of the light receiving surface and z-axis, and a diffusion member is provided around the center of the light receiving surface.

According to the present embodiment, unevenness of illuminance on an illuminated area in directions along both axes can be further reduced by diffusing light which travels toward the front along the optical axis.

In an illumination device according to a sixth embodiment of the present invention, the center of the light exiting surface is defined as the point of intersection of the light exiting surface and z-axis, a surface containing the center of the light exiting surface is defined as an upper surface, and a diffusion member is provided at the boundary between the upper surface and the side.

According to the present embodiment, unevenness of illuminance on an illuminated area in directions along both axes can be further reduced by controlling light beams forming a larger angle with respect to the central axis (optical axis) in a more satisfactory way.

In an illumination device according to a seventh embodiment of the present invention, a bottom is defined as a plane formed in x-y plane containing the origin, and a diffusion member is provided on the bottom.

According to the present embodiment with the diffusion member provided on the bottom, nonuniformity of intensity of light on an illuminated area can be reduced by preventing light beams caused by total reflection inside the optical element, light beams reflected by the illuminated area, light beams from adjacent optical elements in the case that plural optical elements are arranged and the like from travelling through the bottom and reaching the illuminated area.

An optical element according to the present invention is used for a planar light source and includes a light receiving surface for receiving light form the planar light source and a light exiting surface. A shape of the planar light source in a plane is symmetric with respect to x-axis and y-axis and length of the shape in x-axis direction is shorter than length of the shape in y-axis direction where the center of the planar light source is set as the origin and two axes orthogonal to each other are selected as x-axis and y-axis. The axis which passes through the origin and is perpendicular to the plane is selected as an optical axis, and the light receiving surface is of a form like a cap, the top of the cap being at the point of intersection between the light receiving surface and the optical axis and any cross section of the cap containing the optical axis being symmetric with respect to the optical axis. Assuming that the maximum value of x-coordinate of the planar light source is a, the maximum value of y-coordinate of the planar light source is b and $$h_{ab} = \frac{(h_a + a) - (h_b + b)}{(h_a + a)},$$

the following relationship holds.

$h_{ab} \leq 0.02$

DESCRIPTION

In certain embodiments of the present invention, LED light sources are used as planar light sources. However, the present invention can be applied to any kinds of planar light sources.

FIGS. 1A to 1D show various examples of planar light sources, in each of which length of lengthwise direction and length of breadthwise direction are different from each other. In FIGS. 1A to 1D LED light sources are represented by solid lines.

Figure 1A:
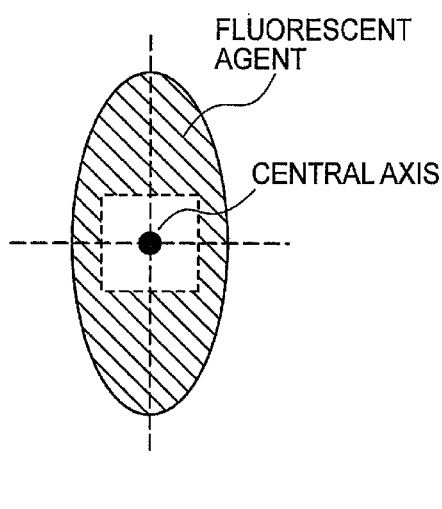
FIGS. 1A to 1D show various examples of planar light sources in which length of lengthwise direction and length of breadthwise direction are different from each other.

FIG. 1A shows an LED light source which includes a single LED chip covered with fluorescent agent.

Figure 1B:
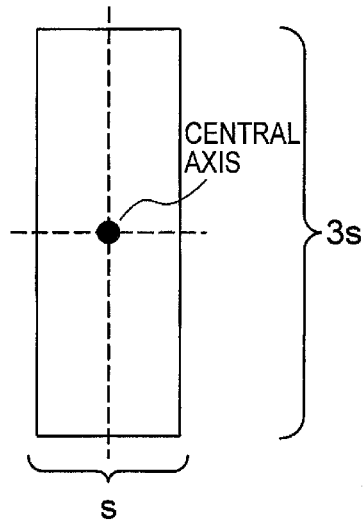

FIG. 1B shows an LED light source which includes a single LED chip length and in which length of lengthwise direction and length of breadthwise direction are different from each other. A ratio of length of lengthwise direction to length of breadthwise direction of the LED light source is 3 to 1.

Figure 1C:
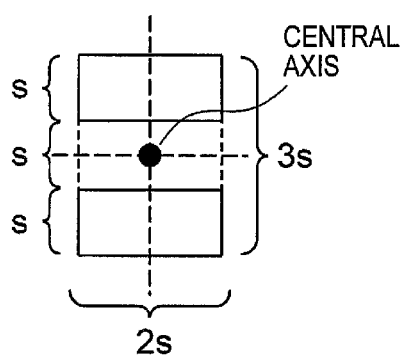

FIG. 1C shows an LED light source which includes two LED chips in which length of lengthwise direction and length of breadthwise direction are different from each other. A ratio of length of lengthwise direction to length of breadthwise direction of the LED light source is 3 to 2.

Figure 1D:
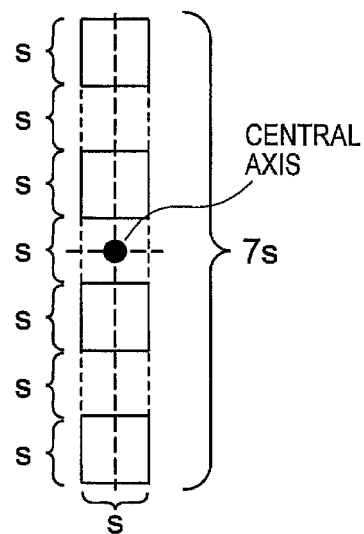

FIG. 1D shows an LED light source which includes four LED chips in each of which length of lengthwise direction and length of breadthwise direction are equal to each other. A ratio of length of lengthwise direction to length of breadthwise direction of the LED light source is 7 to 1.

Figure 2:
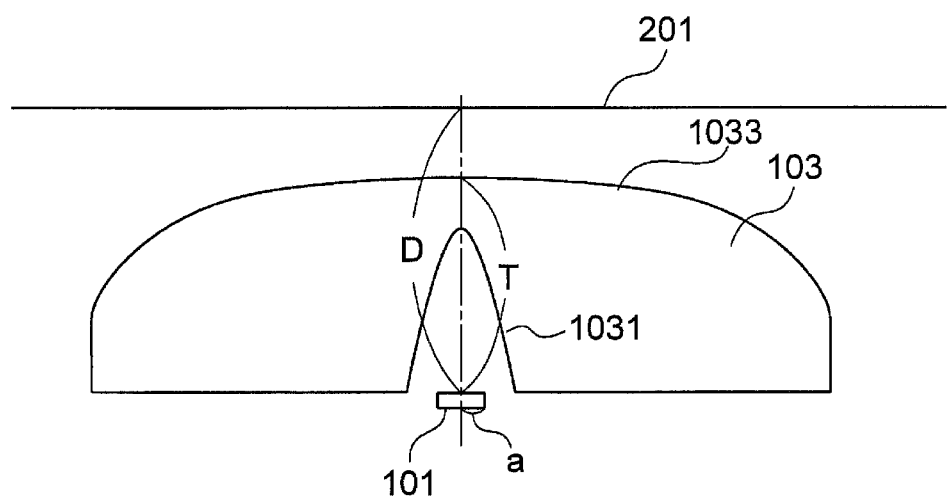
FIG. 2 shows a cross section of an LED light source and an optical element, the cross section containing the central axis which passes through the center of the LED light source and is perpendicular to the plane of the light source, and the axis in the breadthwise direction (x-axis) in the plane of the light source.

FIG. 2 shows a cross section of an LED light source 101 and an optical element 103. The cross section contains the central axis which passes through the center of the LED light source 101 and is perpendicular to the plane of the light source, and the axis in the breadthwise direction (x-axis) in the plane of the light source.

Figure 3:
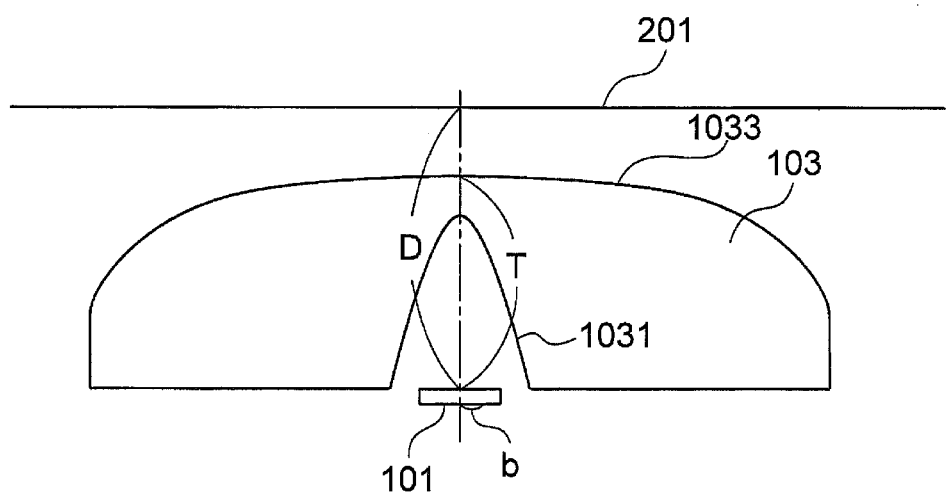
FIG. 3 shows a cross section of an LED light source and an optical element, the cross section containing the central axis which passes through the center of the LED light source and is perpendicular to the plane of the light source, and the axis in the lengthwise direction (y-axis) in the plane of the light source.

FIG. 3 shows a cross section of an LED light source 101 and an optical element 103. The cross section contains the central axis which passes through the center of the LED light source 101 and is perpendicular to the plane of the light source, and the axis in the lengthwise direction (y-axis) in the plane of the light source.

The plane of the LED light source 101 has a shape which is symmetric with respect to x-axis and y-axis. Length in the x-axis direction of the plane of the LED light source 101 is 2a while length in the y-axis direction thereof is 2b. "a" is less than "b". The optical element has a light receiving surface 1031 and a light exiting surface 1033. The light receiving surface 1031 is formed like a cap which covers the LED light source 101. The top of the cap is located at the point of intersection of the light receiving surface 1031 and the central axis. A shape of a cross section of the light receiving surface 1031 which contains the central axis is symmetric with respect to the central axis. The plane of the LED light source 101 and the bottom of the optical element 103 are flush with each other. A distance between the point of intersection of the central axis and the plane of the LED light source 101 and the point of intersection of the central axis and the light exiting surface 1033 is represented by T. A distance between the plane of the LED light source 101 and an illuminated area is represented by D.

Figure 4:
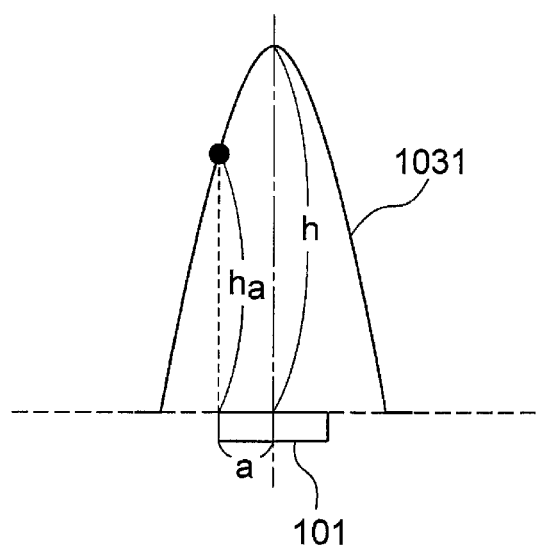
FIG. 4 shows a cross section of the LED light source and the light receiving surface, the cross section containing the central axis which passes through the center of the LED light source and is perpendicular to the plane of the light source and the axis in the breadthwise direction (x-axis)

FIG. 4 shows a cross section of the LED light source 101 and the light receiving surface 1031. The cross section contains the central axis which passes through the center of the LED light source 101 and is perpendicular to the plane of the light source, and the axis in the breadthwise direction (x-axis). In FIG. 4, a distance between the plane of the light source 101 and the top of the light receiving surface 1031 is represented by h. Further, a distance between the light receiving surface 1031 and the plane of the light source at the locations at which x=a or x=−a is represented by $h_a$.

Figure 5:
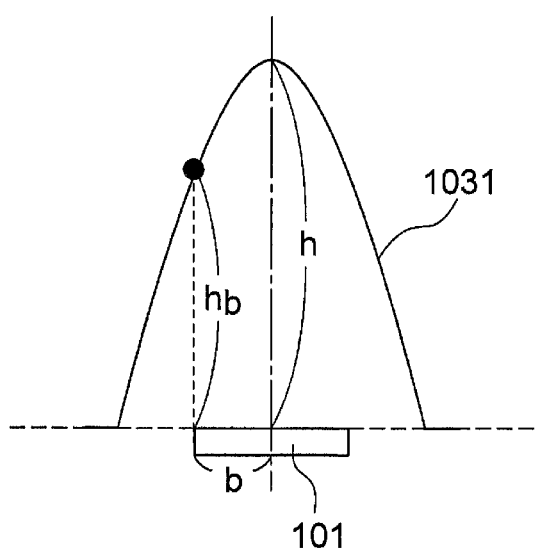
FIG. 5 shows a cross section of the LED light source and the light receiving surface, the cross section contains the central axis which passes through the center of the LED light source and is perpendicular to the plane of the light source and the axis in the lengthwise direction (y-axis)

FIG. 5 shows a cross section of the LED light source 101 and the light receiving surface 1031. The cross section contains the central axis which passes through the center of the LED light source 101 and is perpendicular to the plane of the light source, and the axis in the lengthwise direction (y-axis). In FIG. 5, a distance between the plane of the light source 101 and the top of the light receiving surface 1031 is represented by h. Further, a distance between the light receiving surface 1031 and the plane of the light source at the locations at which y=b or y=−b is represented by $h_b$.

Examples of the illumination device according to the present invention and a comparative example will be described below.

EXAMPLE 1

Specifications of the illumination device of Example 1 are as below.

TABLE 1

| | Unit: mm |
| --- | --- |
| a | 0.25 |
| b | 0.6 |
| h | 3.810 |
| $h_a$ | 3.721 |
| $h_b$ | 3.3 |
| T | 4.890 |
| D | 9.0 |

The light receiving surface 1031 is biconic and represented by the following equation.

$$z = \frac{c_x x^2 + c_y y^2}{1 + \sqrt{1 - (1 + k_x)c_x^2 x^2 - (1 + k_y)c_y^2 y^2}} \quad (1)$$

$$c_x = \frac{1}{R_x}, c_y = \frac{1}{R_y}.$$

"z" represents distance in the central axis direction between the top of the light receiving surface and a point on the light receiving surface 1031. "$c_x$" and "$c_y$" represent curvature in xz cross section and that in yz cross section, respectively. "$R_x$" and "$R_y$" represent a radius of curvature in xz cross section and that in yz cross section, respectively. "$k_x$" and "$k_y$" represent conic constant in xz cross section and that in yz cross section, respectively.

Data for the light receiving surface 1031 are as below.

TABLE 2

| | |
|---|---|
| $R_x$ | 0.350 mm |
| $R_y$ | 0.392 mm |
| $k_x$ | −0.990 |
| $k_y$ | −1.010 |

In the present example, letting $$h_{ab} = \frac{(h_a + a) - (h_b + b)}{(h_a + a)} \quad (2)$$

$h_{ab} = 0.45\%$.,

The light exiting surface 1033 is convex in the direction away from the LED light source 101 and represented by the following equation.

$$z = \frac{cr^2}{1 + \sqrt{1 - (1+k)c^2 r^2}} + \sum_{i=1}^{N} A_i r^i \quad (3)$$

$c = 1/R$ $r^2 = x^2 + y^2$

"z" represents distance in the central axis direction between the point of intersection of the light exiting surface 1033 and the central axis and a point on the light exiting surface 1033. "c" represents curvature. "R" represents a radius of curvature. "k" represents conic constant. Ai represents aspheric coefficients.

Data for the light exiting surface 1033 are as below.

TABLE 3

| | |
|---|---|
| R | 55.72036 |
| k | 0 |
| A4 | 0.000288 |
| A6 | −2.29E−07 |
| A8 | 7.10E−09 |
| A10 | 2.66E−11 |
| A12 | 4.33E−13 |

Effectiveness of the illumination device of Example 1 will be described below.

Figure 6:
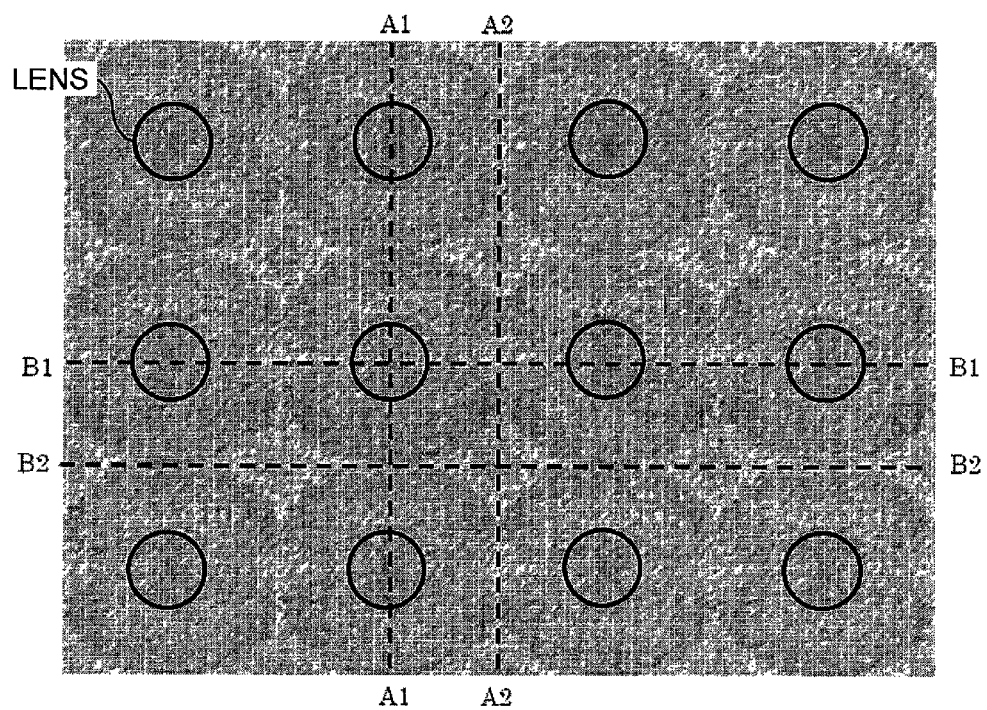
FIG. 6 shows an illuminance distribution on the area illuminated by the illumination device of Example 1.

FIG. 6 shows an illuminance distribution on the area 201 illuminated by the illumination device of Example 1. In FIG. 6, the horizontal direction is x-axis direction while the vertical direction is y-axis direction. In FIG. 6, circles drawn with solid lines represent optical surfaces of the optical elements 103. The plural optical elements (lenses) 103 are arranged on the plane in such a way that they are spaced at intervals of 50 millimeters in x-axis direction and y-axis direction. In FIG. 6, four optical elements are arranged in x-axis direction while three optical elements are arranged in y-axis direction. In FIG. 6, the darker the shade of gray, the lower the illuminance is, and the paler the shade of gray, the higher the illuminance is. Dotted lines A1 and B1 respectively represent yz cross section and xz cross section which contain the centers of the light sources and those of the lenses. Dotted lines A2 and B2 respectively represent yz cross section and xz cross section which contain the midpoints between centers of adjacent optical elements.

FIGS. 7A to 7D show distributions of illuminance in yz cross section and in xz cross section made by the illumination device of Example 1.

Figure 7A:
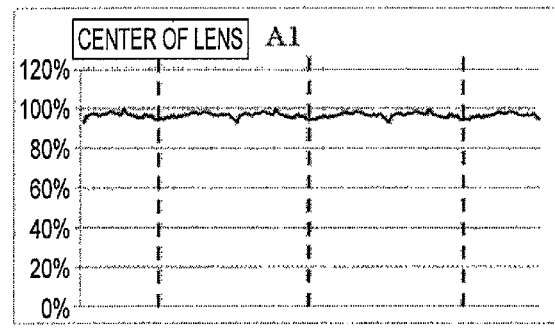
FIGS. 7A to 7D show distributions of illuminance in yz cross section and in xz cross section made by the illumination device of Example 1.

FIG. 7A shows a distribution of illuminance in yz cross section (A1 cross section) which contains the centers of the optical elements. The horizontal axis of FIG. 7A represents position along y-axis while the vertical axis of FIG. 7A represents relative illuminance. The maximum value of relative illuminance is represented as 100%. In FIG. 7A the center positions of the optical elements (lenses) are represented by dotted lines.

Figure 7B:
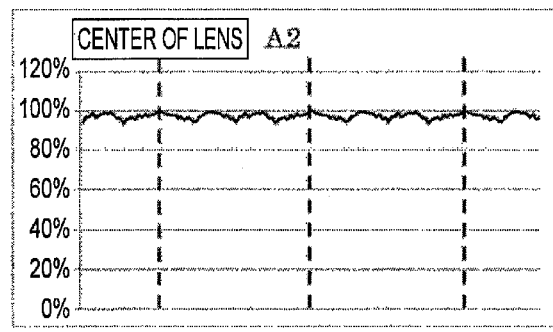

FIG. 7B shows a distribution of illuminance in yz cross section (A2 cross section) which contains the midpoints between centers of adjacent optical elements. The horizontal axis of FIG. 7B represents position along y-axis while the vertical axis of FIG. 7B represents relative illuminance. The maximum value of relative illuminance is represented as 100%. In FIG. 7B the center positions of the optical elements (lenses) are represented by dotted lines.

Figure 7C:
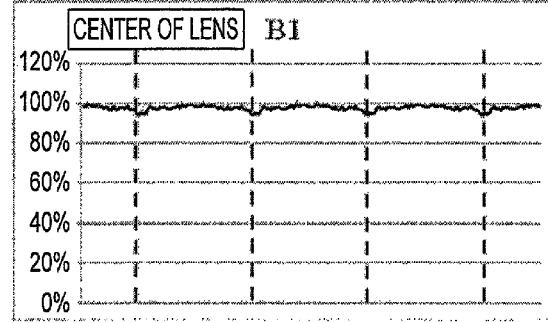

FIG. 7C shows a distribution of illuminance in xz cross section (B1 cross section) which contains the centers of the optical elements. The horizontal axis of FIG. 7C represents position along x-axis while the vertical axis of FIG. 7C represents relative illuminance. The maximum value of relative illuminance is represented as 100%. In FIG. 7C the center positions of the optical elements (lenses) are represented by dotted lines.

Figure 7D:
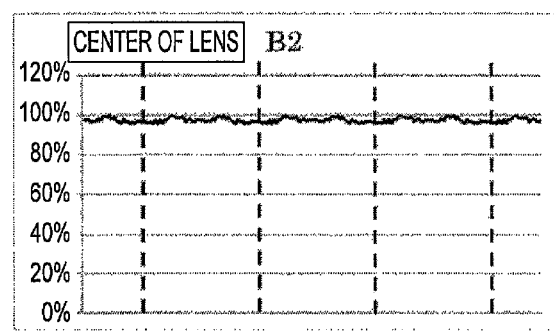

FIG. 7D shows a distribution of illuminance in xz cross section (B2 cross section) which contains the midpoints between centers of adjacent optical elements. The horizontal axis of FIG. 7D represents position along x-axis while the vertical axis of FIG. 7D represents relative illuminance. The maximum value of relative illuminance is represented as 100%. In FIG. 7D the center positions of the optical elements (lenses) are represented by dotted lines.

COMPARATIVE EXAMPLE 1

Comparative Example 1 corresponds to Example 1. Specifications of the illumination device of Comparative Example 1 are equal to those of the illumination device of Example 1 except the shape of the light receiving surface. Data for the light receiving surface are as below.

TABLE 4

| | Unit: mm |
|---|---|
| a | 0.25 |
| b | 0.6 |
| h | 3.810 |
| $h_a$ | 3.416 |
| $h_b$ | 2.405 |
| T | 4.890 |
| D | 9.0 |

The shape of the light receiving surface is symmetric with respect to the axis and represented by the following equation.

$$z = \frac{cr^2}{1 + \sqrt{1 - (1+k)c^2 r^2}} \quad (4)$$

$\frac{1}{c} = R$ $r^2 = x^2 + y^2$

"z" represents distance in the central axis direction between the top of the light exiting surface and a point on the light exiting surface. "c" represents curvature. "R" represents a radius of curvature. "k" represents conic constant.

Coefficients of Equation (4) are as below.

TABLE 5

| | |
|---|---|
| R | 0.370 |
| k | −1.000 |

In the present example, letting $$h_{ab} = \frac{(h_a + a) - (h_b + b)}{(h_a + a)} \quad (2)$$

$$h_{ab} = 0.18\%,$$

Figure 8:
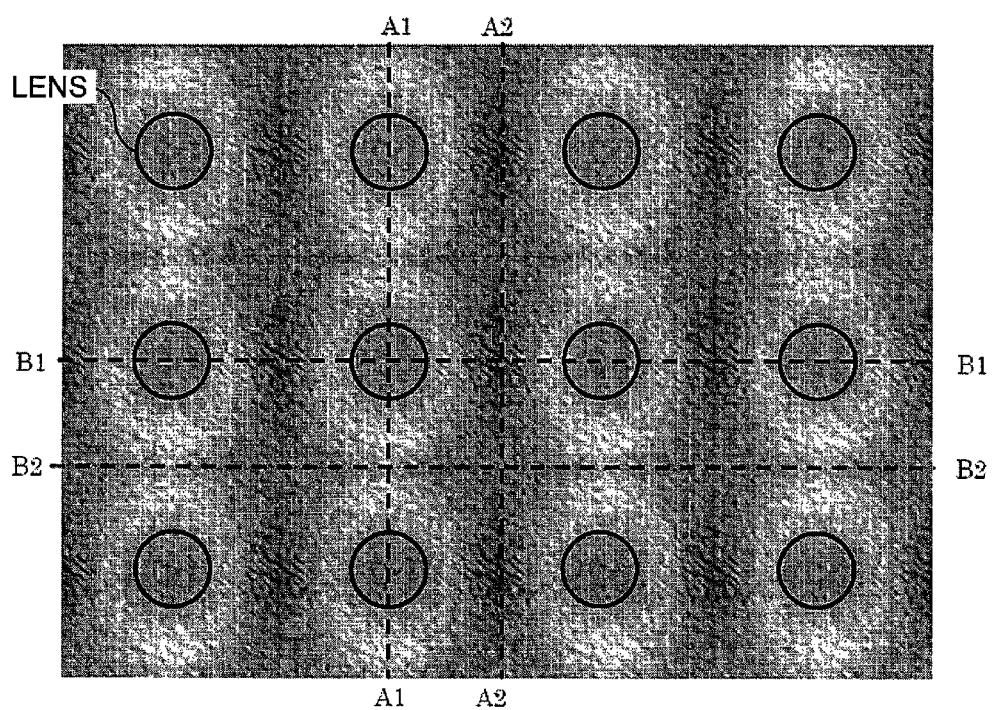
FIG. 8 shows an illuminance distribution on the area illuminated by the illumination device of Comparative Example 1.

FIG. 8 shows an illuminance distribution on the area illuminated by the illumination device of Comparative Example 1. In FIG. 8, the horizontal direction is x-axis direction while the vertical direction is y-axis direction. In FIG. 8, circles drawn with solid lines represent optical surfaces of the optical elements (lenses). The plural optical elements are arranged on the plane in such a way that they are spaced at intervals of 50 millimeters in x-axis direction and y-axis direction. In FIG. 8, four optical elements are arranged in x-axis direction while three optical elements are arranged in y-axis direction. In FIG. 8, the darker the shade of gray, the lower the illuminance is, and the paler the shade of gray, the higher the illuminance is. Dotted lines A1 and B1 respectively represent yz cross section and xz cross section which contain the centers of the light sources and those of the lenses. Dotted lines A2 and B2 respectively represent yz cross section and xz cross section which contain the midpoints between centers of adjacent optical elements.

FIGS. 9A to 9D show distributions of illuminance in yz cross section and in xz cross section made by the illumination device of Comparative Example 1.

Figure 9A:
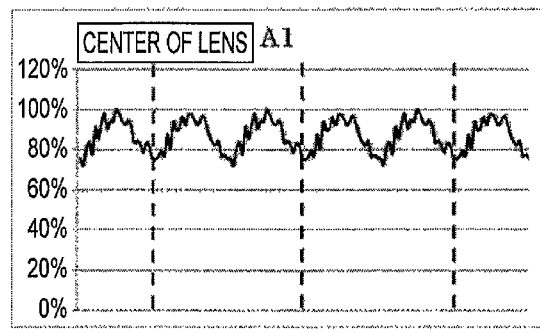
FIGS. 9A to 9D show distributions of illuminance in yz cross section and in xz cross section made by the illumination device of Comparative Example 1.

FIG. 9A shows a distribution of illuminance in yz cross section (A1 cross section) which contains the centers of the optical elements. The horizontal axis of FIG. 9A represents position along y-axis while the vertical axis of FIG. 9A represents relative illuminance. The maximum value of relative illuminance is represented as 100%. In FIG. 9A the center positions of the optical elements (lenses) are represented by dotted lines.

Figure 9B:
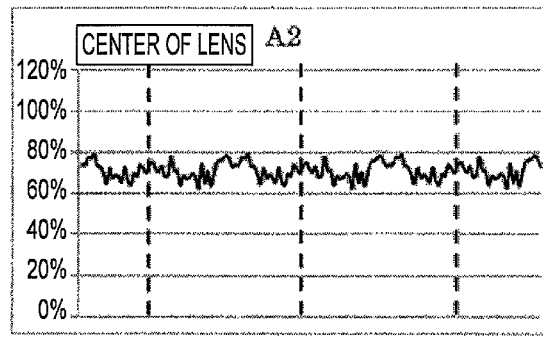

FIG. 9B shows a distribution of illuminance in yz cross section (A2 cross section) which contains the midpoints between centers of adjacent optical elements. The horizontal axis of FIG. 9B represents position along y-axis while the vertical axis of FIG. 9B represents relative illuminance. The maximum value of relative illuminance is represented as 100%. In FIG. 9B the center positions of the optical elements (lenses) are represented by dotted lines.

Figure 9C:
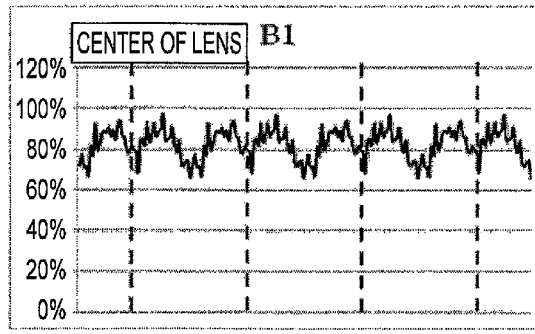

FIG. 9C shows a distribution of illuminance in xz cross section (B1 cross section) which contains the centers of the optical elements. The horizontal axis of FIG. 9C represents position along x-axis while the vertical axis of FIG. 9C represents relative illuminance. The maximum value of relative illuminance is represented as 100%. In FIG. 9C the center positions of the optical elements (lenses) are represented by dotted lines.

Figure 9D:
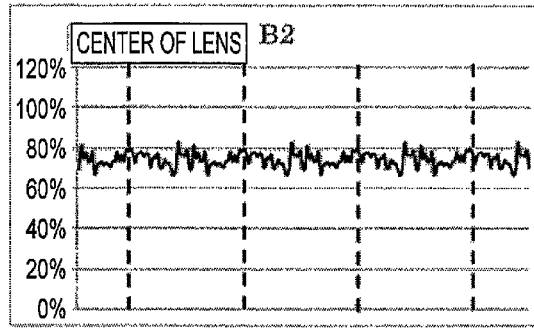

FIG. 9D shows a distribution of illuminance in xz cross section (B2 cross section) which contains the midpoints between centers of adjacent optical elements. The horizontal axis of FIG. 9D represents position along x-axis while the vertical axis of FIG. 9D represents relative illuminance. The maximum value of relative illuminance is represented as 100%. In FIG. 9D the center positions of the optical elements (lenses) are represented by dotted lines.

If comparisons are made between any one of FIGS. 7A to 7D and its counterpart of FIGS. 9A to 9D, unevenness of illuminance made by the illumination device of Comparative Example 1 is greater in each cross section. Particularly, in A1 and B1 cross sections unevenness of illuminance made by the illumination device of Comparative Example 1 is much greater.

EXAMPLE 2

Specifications of the illumination device of Example 2 are as below.

TABLE 6

| | Unit: mm |
|---|---|
| a | 0.25 |
| b | 0.6 |
| h | 3.800 |
| $h_a$ | 3.660 |
| $h_b$ | 3.289 |
| T | 4.500 |
| D | 9.4 |

The light receiving surface 1031 is biconic and represented by the following equation.

$$z = \frac{c_x x^2 + c_y y^2}{1 + \sqrt{1 - (1 + k_x)c_x^2 x^2 - (1 + k_y)c_y^2 y^2}} \quad (1)$$

$$c_x = \frac{1}{R_x}, c_y = \frac{1}{R_y}.$$

"z" represents distance in the central axis direction between the top of the light receiving surface and a point on the light receiving surface 1031. "$c_x$" and "$c_y$" represent curvature in xz cross section and that in yz cross section, respectively. "$R_x$" and "$R_y$" represent a radius of curvature in xz cross section and that in yz cross section, respectively. "$k_x$" and "$k_y$" represent conic constant in xz cross section and that in yz cross section, respectively.

Data for the light receiving surface 1031 are as below.

TABLE 7

| | |
|---|---|
| $R_x$ | 0.220 mm |
| $R_y$ | 0.350 mm |
| $k_x$ | −1.050 |
| $k_y$ | −1.010 |

In the present example, letting $$h_{ab} = \frac{(h_a + a) - (h_b + b)}{(h_a + a)} \quad (2)$$

$$h_{ab} = 0.53\%,$$

The light exiting surface 1033 is convex in the direction away from the LED light source 101 and represented by the following equation.

$$z = \frac{cr^2}{1+\sqrt{1-(1+k)c^2r^2}} + \sum_{i=1}^{N} A_i r^i \qquad (3)$$

$$c = 1/R$$

$$r^2 = x^2 + y^2$$

"z" represents distance in the central axis direction between the point of intersection of the light exiting surface 1033 and the central axis and a point on the light exiting surface 1033. "c" represents curvature. "R" represents a radius of curvature. "k" represents conic constant. Ai represents aspheric coefficients.

Data for the light exiting surface 1033 are as below.

TABLE 8

| R | ∞ |
|---|---|
| k | 0 |
| A4 | 0.000589 |
| A6 | −2.10E−06 |
| A8 | 1.10E−08 |
| A10 | −6.71E−10 |
| A12 | 1.14E−11 |

Effectiveness of the illumination device of Example 2 will be described below.

Figure 10:
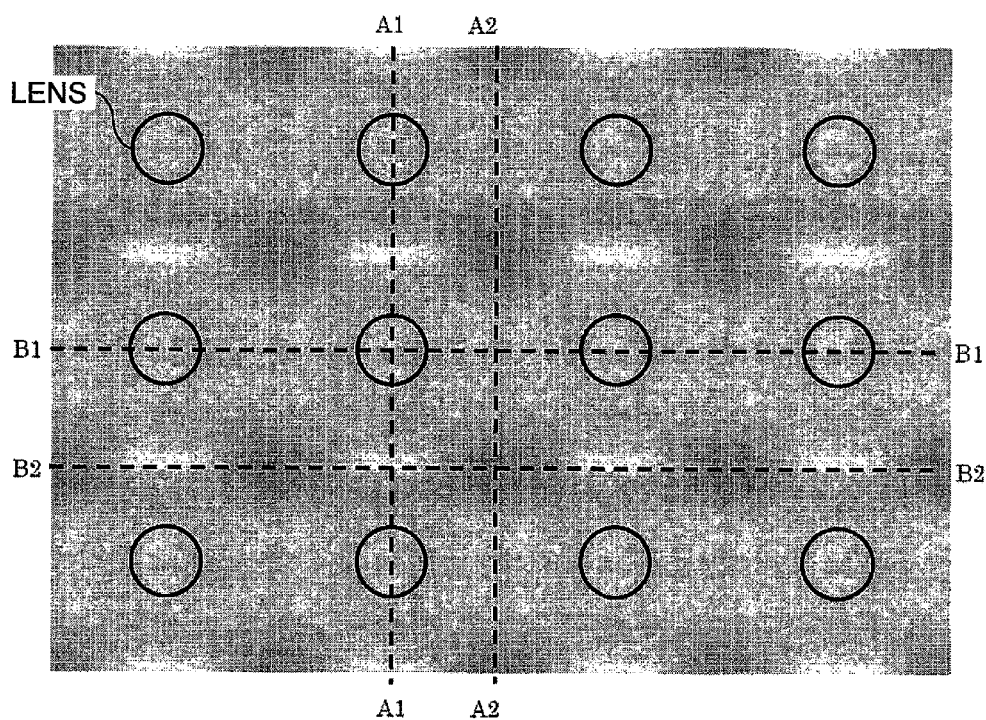
FIG. 10 shows an illuminance distribution on the area illuminated by the illumination device of Example 2.

FIG. 10 shows an illuminance distribution on the area 201 illuminated by the illumination device of Example 2. In FIG. 10, the horizontal direction is x-axis direction while the vertical direction is y-axis direction. In FIG. 10, circles drawn with solid lines represent optical surfaces of the optical elements (lenses) 103. The plural optical elements (lenses) 103 are arranged on the plane in such a way that they are spaced at intervals of 50 millimeters in x-axis direction and y-axis direction. In FIG. 10, four optical elements (lenses) are arranged in x-axis direction while three optical elements (lenses) are arranged in y-axis direction. In FIG. 10, the darker the shade of gray, the lower the illuminance is, and the paler the shade of gray, the higher the illuminance is. Dotted lines A1 and B1 respectively represent yz cross section and xz cross section which contain the centers of the light sources and those of the lenses. Dotted lines A2 and B2 respectively represent yz cross section and xz cross section which contain the midpoints between centers of adjacent optical elements.

FIGS. 11A to 11D show distributions of illuminance in yz cross section and in xz cross section made by the illumination device of Example 2.

Figure 11A:
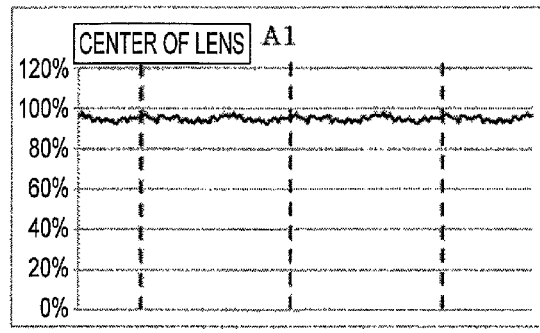
FIGS. 11A to 11D show distributions of illuminance in yz cross section and in xz cross section made by the illumination device of Example 2.

FIG. 11A shows a distribution of illuminance in yz cross section (A1 cross section) which contains the centers of the optical elements. The horizontal axis of FIG. 11A represents position along y-axis while the vertical axis of FIG. 11A represents relative illuminance. The maximum value of relative illuminance is represented as 100%. In FIG. 11A the center positions of the optical elements (lenses) are represented by dotted lines.

Figure 11B:
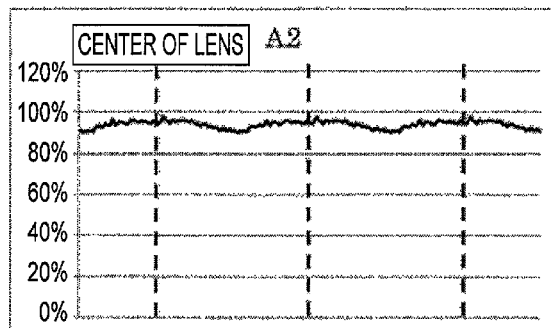

FIG. 11B shows a distribution of illuminance in yz cross section (A2 cross section) which contains the midpoints between centers of adjacent optical elements. The horizontal axis of FIG. 11B represents position along y-axis while the vertical axis of FIG. 11B represents relative illuminance. The maximum value of relative illuminance is represented as 100%. In FIG. 11B the center positions of the optical elements (lenses) are represented by dotted lines.

Figure 11C:
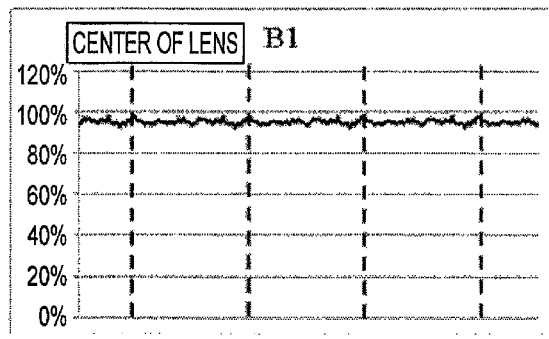

FIG. 11C shows a distribution of illuminance in xz cross section (B1 cross section) which contains the centers of the optical elements (lenses). The horizontal axis of FIG. 11C represents position along x-axis while the vertical axis of FIG. 11C represents relative illuminance. The maximum value of relative illuminance is represented as 100%. In FIG. 11C the center positions of the optical elements (lenses) are represented by dotted lines.

Figure 11D:
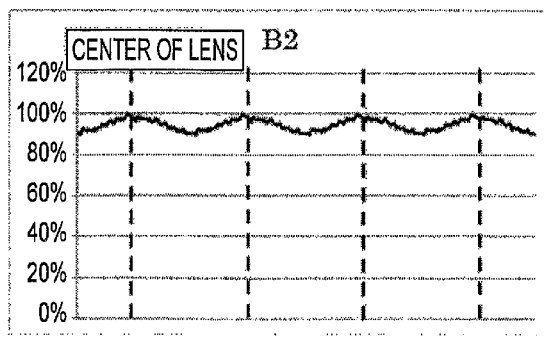

FIG. 11D shows a distribution of illuminance in xz cross section (B2 cross section) which contains the midpoints between centers of adjacent optical elements (lenses). The horizontal axis of FIG. 11D represents position along x-axis while the vertical axis of FIG. 11D represents relative illuminance. The maximum value of relative illuminance is represented as 100%. In FIG. 11D the center positions of the optical elements (lenses) are represented by dotted lines.

Examples with Biconic Light Receiving Surfaces

Tables 9 to 11 show specifications of examples of illumination devices with biconic light receiving surfaces. The examples include Example 1 and Example 2. Each light receiving surface is represented by Equation (1) while each light exiting surface is represented by Equation (3). Table 9 shows specifications of light sources and data of light receiving surfaces. Table 10 shows data of light receiving surfaces and unevenness of illuminance. Table 11 show data of light exiting surfaces.

TABLE 9

| Example | D(mm) | T(mm) | a(mm) | b(mm) | h(mm) | $R_x$(mm) | $R_y$(mm) | $k_x$ | $k_y$ |
|---|---|---|---|---|---|---|---|---|---|
| 1 | 9.0 | 4.890 | 0.25 | 0.60 | 3.810 | 0.350 | 0.392 | −0.990 | −1.010 |
| 2 | 9.4 | 4.500 | 0.25 | 0.60 | 3.800 | 0.220 | 0.350 | −1.050 | −1.010 |
| 3 | 9.3 | 5.478 | 0.30 | 0.47 | 4.600 | 0.220 | 0.240 | −1.000 | −1.000 |
| 4 | 9.0 | 5.830 | 0.40 | 0.50 | 4.710 | 0.319 | 0.330 | −0.962 | −0.962 |
| 5 | 9.0 | 5.740 | 0.25 | 0.60 | 4.771 | 0.310 | 0.346 | −0.976 | −0.963 |
| 6 | 9.0 | 5.760 | 0.20 | 0.50 | 4.765 | 0.303 | 0.357 | −0.976 | −0.963 |
| 7 | 8.5 | 4.600 | 0.25 | 0.60 | 4.000 | 0.313 | 0.350 | −1.085 | −1.010 |
| 8 | 15.0 | 5.150 | 0.40 | 0.60 | 4.900 | 0.514 | 0.531 | −0.983 | −0.948 |
| 9 | 9.0 | 5.200 | 0.40 | 0.50 | 4.817 | 0.377 | 0.411 | −0.979 | −0.952 |
| 10 | 9.0 | 5.084 | 0.30 | 0.50 | 4.800 | 0.381 | 0.412 | −0.979 | −0.952 |
| 11 | 9.0 | 5.171 | 0.30 | 0.60 | 4.554 | 0.350 | 0.378 | −0.979 | −0.952 |
| 12 | 9.0 | 5.426 | 0.25 | 0.60 | 4.572 | 0.316 | 0.366 | −0.949 | −0.949 |
| 13 | 9.0 | 5.458 | 0.25 | 0.60 | 4.424 | 0.316 | 0.367 | −0.949 | −0.949 |
| 14 | 9.0 | 5.389 | 0.25 | 0.60 | 4.379 | 0.323 | 0.351 | −0.948 | −0.949 |
| 15 | 9.0 | 5.160 | 0.25 | 0.60 | 4.000 | 0.310 | 0.360 | −0.949 | −0.943 |
| 16 | 12.0 | 5.160 | 0.25 | 0.60 | 3.980 | 0.350 | 0.417 | −0.990 | −0.949 |
| 17 | 9.5 | 5.500 | 0.25 | 0.60 | 4.300 | 0.450 | 0.520 | −1.000 | −1.000 |
| 18 | 15.0 | 4.500 | 0.25 | 0.90 | 3.500 | 0.450 | 0.600 | −0.940 | −0.900 |
| 19 | 9.5 | 5.300 | 0.20 | 0.60 | 4.500 | 0.250 | 0.324 | −0.949 | −0.995 |

TABLE 9-continued

| Example | D(mm) | T(mm) | a(mm) | b(mm) | h(mm) | $R_x$(mm) | $R_y$(mm) | $k_x$ | $k_y$ |
|---|---|---|---|---|---|---|---|---|---|
| 20 | 9.5 | 4.800 | 0.20 | 0.60 | 3.800 | 0.200 | 0.300 | −1.050 | −1.045 |
| 21 | 9.4 | 4.500 | 0.25 | 0.60 | 3.800 | 0.220 | 0.350 | −1.050 | −1.010 |

The following relationship holds for the data in Table 9.

$$b/a \geq 1.2$$

TABLE 10

| Example | $h_a$(mm) | $h_b$(mm) | $h_{ab}$ | Unevenness of illuminance $(I_{max}-I_{min})/I_{max}$ |
|---|---|---|---|---|
| 1 | 3.721 | 3.353 | 0.45% | 6.5% |
| 2 | 3.660 | 3.289 | 0.53% | 10.4% |
| 3 | 4.395 | 4.140 | 1.82% | 5.2% |
| 4 | 4.455 | 4.323 | 0.66% | 5.6% |
| 5 | 4.670 | 4.236 | 1.71% | 5.1% |
| 6 | 4.699 | 4.408 | −0.19% | 4.1% |
| 7 | 3.901 | 3.489 | 1.50% | 5.3% |
| 8 | 4.744 | 4.555 | −0.21% | 7.9% |
| 9 | 4.604 | 4.508 | −0.07% | 7.5% |
| 10 | 4.681 | 4.491 | −0.20% | 9.0% |
| 11 | 4.425 | 4.063 | 1.31% | 11.9% |
| 12 | 4.472 | 4.063 | 1.26% | 6.7% |
| 13 | 4.325 | 3.915 | 1.29% | 8.7% |
| 14 | 4.281 | 3.845 | 1.90% | 6.4% |
| 15 | 3.898 | 3.478 | 1.68% | 10.7% |
| 16 | 3.891 | 3.537 | 0.11% | 8.9% |
| 17 | 4.231 | 3.954 | −1.64% | 6.4% |
| 18 | 3.430 | 2.782 | −0.05% | 8.6% |
| 19 | 4.419 | 3.942 | 1.67% | 6.3% |
| 20 | 3.701 | 3.225 | 1.96% | 8.4% |
| 21 | 3.660 | 3.289 | 0.53% | 6.8% |

In Table 10, unevenness of illuminance is represented by the following equation (Imax−Imin)/Imax where Imax represents the maximum value of illuminance while Imin represents the minimum value of illuminance in the illuminated area. The values of unevenness of illuminance of Examples 1 to 21 are less than 12%. On the other hand, the value of unevenness of illuminance of Comparative Example 1 is 37.2%.

Figure 12:
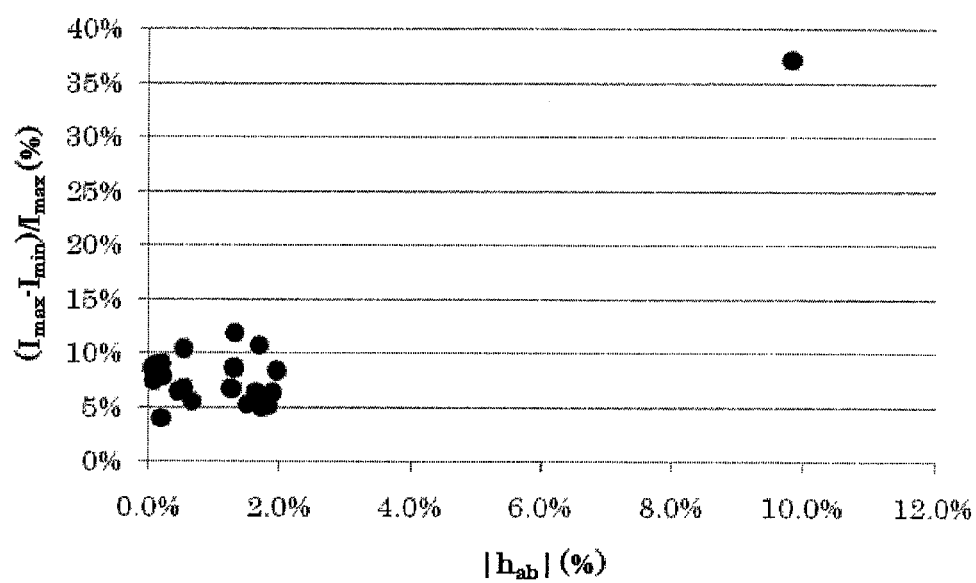
FIG. 12 shows a relationship between the absolute value of $h_{ab}$ and the unevenness of illuminance.

FIG. 12 shows a relationship between the absolute value of $h_{ab}$ and the unevenness of illuminance.

EXAMPLE 22

Specifications of the illumination device of Example 22 are as below.

TABLE 12

| | Unit: mm |
|---|---|
| a | 0.25 |
| b | 0.6 |
| h | 4.000 |
| $h_a$ | 3.915 |
| $h_b$ | 3.487 |
| T | 4.600 |
| D | 8.5 |

The light receiving surface represented by the following equation.

$$z = \sum_{i=0}\sum_{j=0} A_{ij} x^i y^j \quad (5)$$

"z" represents distance in the central axis direction between the top of the light receiving surface and a point on the light receiving surface.

TABLE 11

| Example | R | k | A4 | A6 | A8 | A10 | A12 |
|---|---|---|---|---|---|---|---|
| 1 | 55.72036 | 0 | 0.000288 | −2.29E−07 | 7.10E−09 | 2.66E−11 | 4.33E−13 |
| 2 | ∞ | 0 | 0.000589 | −2.10E−06 | 1.10E−08 | −6.71E−10 | 1.14E−11 |
| 3 | 43.62 | 0 | 0.000345 | −2.41E−07 | 9.93E−09 | 4.87E−11 | 0.00E+00 |
| 4 | 43.10355 | 0 | 0.000226 | −8E−07 | 6.09E−09 | 3.34E−10 | 0.00E+00 |
| 5 | 43.48094 | 0 | 0.000346 | −2.2E−07 | 1.02E−08 | 5.22E−11 | 0.00E+00 |
| 6 | 374.681 | 0 | 0.000336 | −1.5E−07 | −2.2E−09 | 2E−12 | 1.43E−12 |
| 7 | 21.36002 | 0 | 0.000399 | −1.8E−06 | 7.33E−08 | −1.4E−09 | 2.54E−11 |
| 8 | 29.15682 | 0 | 0.000186 | 2.43E−07 | 3.67E−08 | 7.83E−10 | 3.46E−12 |
| 9 | 96.74173 | 0 | 0.000291 | −5.66E−07 | −1.95E−09 | 1.54E−10 | 1.23E−13 |
| 10 | 68.93658 | 0 | 0.000288 | −7.45E−07 | −5.00E−09 | 1.58E−10 | 1.70E−13 |
| 11 | ∞ | 0 | 0.000344 | 6.13E−07 | 8.74E−09 | 5.68E−11 | 4.38E−13 |
| 12 | ∞ | 0 | −0.00029 | −1.3E−07 | −9E−09 | −3.9E−11 | −1.4E−12 |
| 13 | 47.82429 | 0 | 0.000299 | 1.35E−07 | 8.75E−09 | 3.37E−11 | 1.34E−12 |
| 14 | 54.28167 | 0 | 0.000311 | −1.5E−07 | 1.13E−08 | 5.51E−11 | 9.38E−13 |
| 15 | 58.20945 | 0 | 0.000293 | −1.8E−07 | 7.53E−09 | 3.82E−11 | 6.41E−13 |
| 16 | 21.53701 | 0 | 0.000582 | −2.8E−06 | −7.6E−08 | 2.26E−09 | 6.8E−13 |
| 17 | 23.71964 | 0 | 0.000493 | −2.3E−06 | −9.7E−08 | 2.22E−09 | −6.9E−12 |
| 18 | 21.37031 | 0 | 0.000399 | −1.8E−06 | 7.33E−08 | −1.4E−09 | 2.54E−11 |
| 19 | 43.10355 | 0 | 0.000226 | −8E−07 | 6.09E−09 | 3.34E−10 | 0.00E+00 |
| 20 | 38.82725 | 0 | 0.000277 | −5.4E−07 | 9.85E−09 | 3.46E−11 | 1.58E−12 |
| 21 | 43.20258 | 0 | 0.000345 | −2.4E−07 | 1.03E−08 | 8.32E−11 | 0.00E+00 |

Data for the light receiving surface are as below.

TABLE 13

| i | j | $A_{ij}$ |
| --- | --- | --- |
| 2 | 0 | 1.36662E+00 |
| 0 | 2 | 1.43611E+00 |
| 4 | 0 | −1.05836E−01 |
| 2 | 2 | −2.03165E−01 |
| 0 | 4 | −3.54284E−02 |
| 6 | 0 | 6.04379E−03 |
| 4 | 2 | 2.25244E−02 |
| 2 | 4 | 6.83951E−03 |
| 0 | 6 | 2.15786E−03 |
| 8 | 0 | −1.37655E−04 |
| 6 | 2 | −1.23183E−03 |
| 4 | 4 | −5.34192E−04 |
| 2 | 6 | −1.65992E−04 |
| 0 | 8 | −1.02210E−04 |
| 10 | 0 | 0.00000E+00 |
| 8 | 2 | 2.53725E−05 |
| 6 | 4 | 1.42596E−05 |
| 4 | 6 | 4.86563E−06 |
| 2 | 8 | 2.35412E−06 |
| 0 | 10 | 2.04035E−06 |

In the present example, letting $$h_{ab} = \frac{(h_a + a) - (h_b + b)}{(h_a + a)} \quad (2)$$

$$h_{ab} = 1.87\%,$$

The light exiting surface is also represented by Equation (5). "z" represents distance in the central axis (z-axis) direction between the intersection of the light exiting surface and the central axis and a point on the light exiting surface.

Data for the light exiting surface are as below.

TABLE 14

| i | j | $A_{ij}$ |
| --- | --- | --- |
| 2 | 0 | −1.20049E−01 |
| 0 | 2 | 8.33568E−03 |
| 4 | 0 | 2.87998E−04 |
| 0 | 4 | 5.88880E−04 |
| 6 | 0 | −2.29164E−07 |
| 0 | 6 | −2.10334E−06 |
| 8 | 0 | 7.10087E−09 |
| 0 | 8 | 1.09600E−08 |
| 10 | 0 | 2.66001E−11 |
| 0 | 10 | −6.70760E−10 |
| 12 | 0 | 4.32883E−13 |
| 0 | 12 | 1.13728E−11 |

The value of unevenness of illuminance of Example 22 is 5.9%.

Other Preferred Embodiments

Figure 13A:
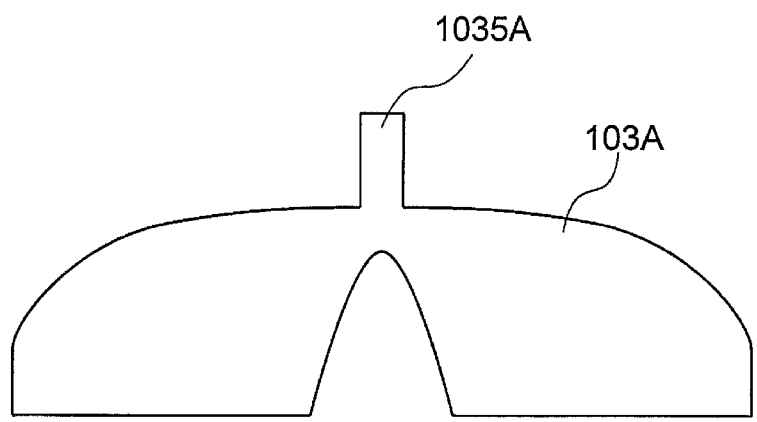
FIGS. 13A and 13B show an optical element (lens) which is manufactured by injection molding and in which a resin supplying gate is provided around the point of intersection between the light exiting surface and the central axis.
Figure 13B:
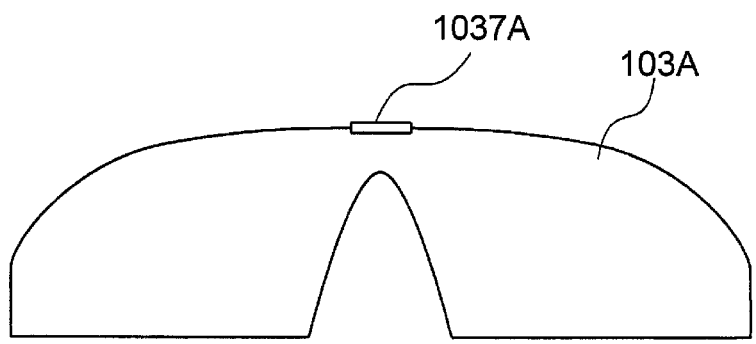

FIGS. 13A and 13B show an optical element (lens) which is manufactured by injection molding and in which a resin supplying gate is provided around the point of intersection between the light exiting surface and the central axis. In the present embodiment the optical element is manufactured by injection molding. FIG. 13A shows the resin supplying gate 1035A and the optical element 103A. FIG. 13B shows the optical element 103A with a gate mark 1037A at which the resin supplying gate 1035A was provided before being removed. In the present embodiment, since the resin supplying gate is provided around the central axis, in the mold of the lens, resin flows from the center of the lens substantially symmetrically with respect to the central axis and thus satisfactory molding can be performed. Since resin flows substantially symmetrically with respect to the central axis, moldability is enhanced and unevenness of refractive index due to pressure and birefringence are reduced. Further, since resin flows substantially symmetrically with respect to the central axis, cycle time of molding is reduced and therefore a greater number of lenses can be molded for the same time period. Such a gate arrangement as mentioned above is sometimes referred to as center gate or pin gate.

Figure 14A:
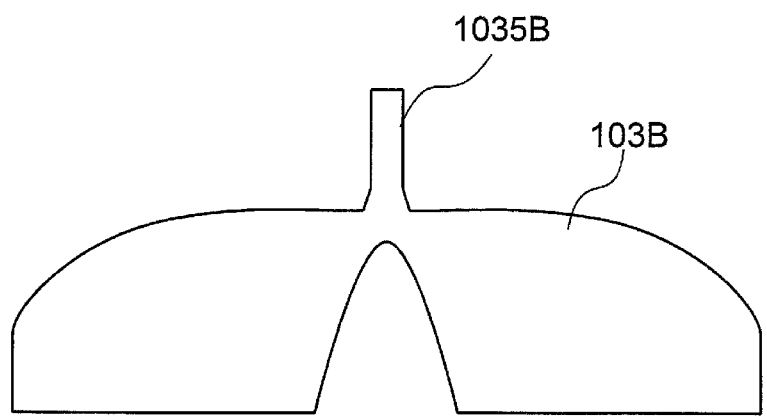
FIGS. 14A and 14B show an optical element (lens) which is manufactured by injection molding and in which a projection in the form of a truncated cone is provided around the point of intersection of the light exiting surface and the central axis and a resin supplying gate is provided on the projection.
Figure 14B:
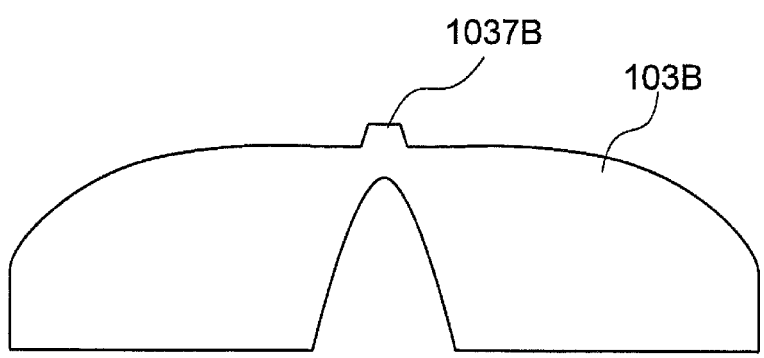

FIGS. 14A and 14B show an optical element (lens) which is manufactured by injection molding and in which a projection in the form of a truncated cone is provided around the point of intersection of the light exiting surface and the central axis and a resin supplying gate is provided on the projection. In the present embodiment the optical element is manufactured by injection molding. FIG. 14A shows the resin supplying gate 1035B and the optical element 103B. FIG. 14B shows the optical element 103B with the projection in the form of a truncated cone 1037B on which the resin supplying gate 1035A was provided before being removed. In the present embodiment, the projection in the form of a truncated cone 1037B provided around the point of intersection of the light exiting surface and the central axis helps diverge the light beam with a high intensity emitted around the center of the light source particularly for an illuminated area located in the proximity of the optical device. Further, since the resin supplying gate is provided around the central axis, in the mold of the lens, resin flows from the center of the lens substantially symmetrically with respect to the central axis and thus satisfactory molding can be performed. Since resin flows substantially symmetrically with respect to the central axis, moldability is enhanced and unevenness of refractive index due to pressure and birefringence are reduced. Further, since resin flows substantially symmetrically with respect to the central axis, cycle time of molding is reduced and therefore a greater number of lenses can be molded for the same time period.

FIGS. 15 to 18 show optical elements provided with a diffusing member on any of its surfaces.

The diffusing member can be made of diffusion materials such as acrylic powder, polystyrene particles, silicon powder, silver powder, titanium oxide powder, aluminium powder, white carbon, magnesia oxide and zinc oxide. Alternatively, the diffusing member can be made by providing microscopic projections or microscopic depressions in spherical, aspherical, conical, triangular pyramid, or quadrangular pyramid shape on any of the surfaces. The microscopic member can be one that is included in a circle of diameter of one millimeter on any of the surfaces. Alternatively, the diffusing member can be made from curved surfaces such as those of a microlens array or from refractive members or total-reflection members such as prisms.

Figure 15:
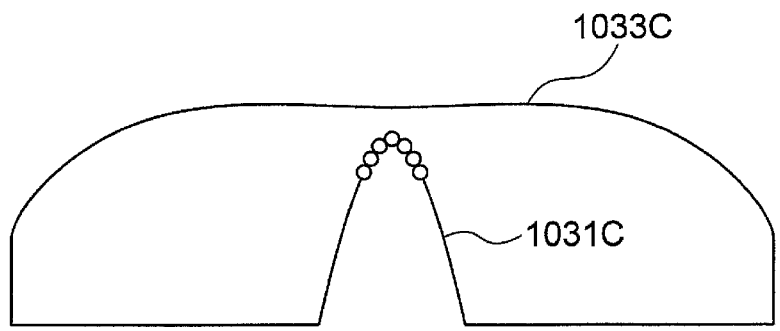
FIG. 15 shows an optical element provided with a diffusion member in an area around the point of intersection of the light receiving surface 1031C and the central axis.

FIG. 15 shows an optical element provided with a diffusion member in an area around the point of intersection of the light receiving surface 1031C and the central axis. Since the light source emits a great amount of light around its center, the diffusion member provided around the central axis is effective particularly when a distance to an illuminated area is small.

Figure 16:
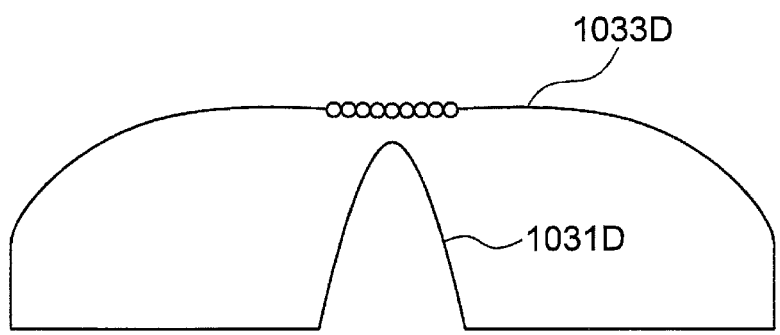
FIG. 16 shows an optical element provided with a diffusion member in an area around the point of intersection of the light exiting surface 1031D and the central axis.

FIG. 16 shows an optical element provided with a diffusion member in an area around the point of intersection of the light exiting surface 1033D and the central axis. The area around the point of intersection with the central axis is defined as the area in which distance from the center of the lens is equal to or less than a half of the radius of the lens. Since the light source emits a great amount of light around its center, the diffusion member provided around the central axis is effective particularly when a distance to an illuminated area is small.

Figure 17:
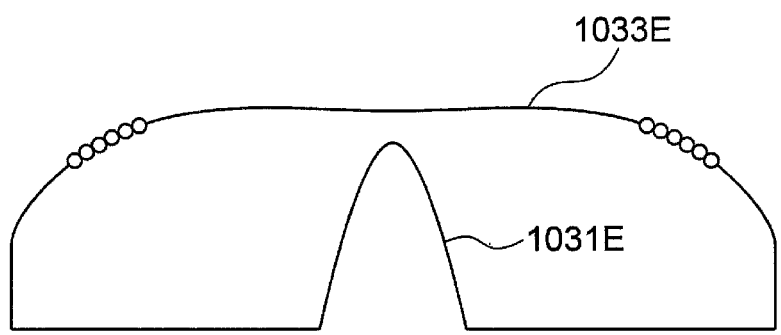
FIG. 17 shows an optical element provided with a diffusion member at the boundary between the upper surface and the side of the lens, where the upper surface is defined as a surface containing the point of intersection of the light receiving surface 1031C of the lens and the central axis.

FIG. 17 shows an optical element provided with a diffusion member at the boundary between the upper surface and the side of the lens, where the upper surface is defined as a surface containing the point of intersection of the light exiting surface 1033E of the lens and the central axis. Since light beams forming a larger angle with respect to the central axis can hardly be controlled, the diffusion member provided in the outer regions of the lens is effective particularly when a distance to an illuminated area is small.

Figure 18:
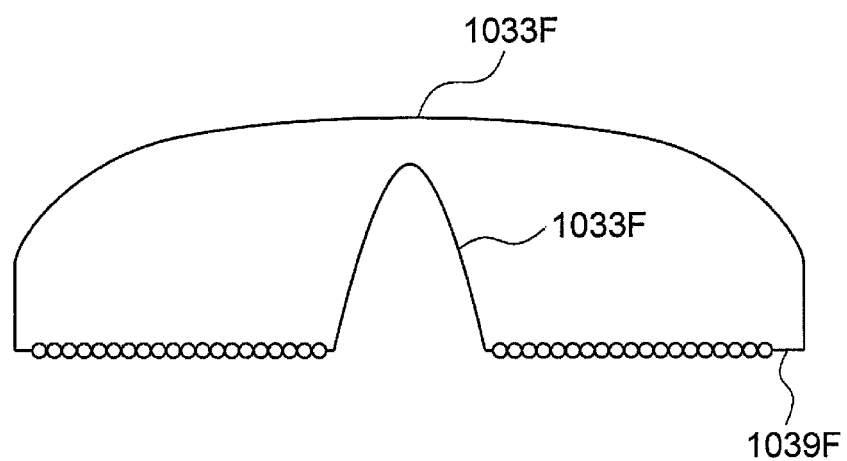
FIG. 18 shows an optical element provided with a diffusion member at the bottom where the bottom is defined as a plane formed in x-y plane containing the origin.

FIG. 18 shows an optical element provided with a diffusion member at the bottom where the bottom is defined as a plane formed in x-y plane containing the origin. Nonuniformity of intensity of light on an illuminated area is generated by light beams caused by total reflection inside the optical element, light beams reflected by the illuminated area, light beams from adjacent optical elements in the case that plural optical elements are arranged and the like, all of which travel through the bottom and reach the illuminated area. So, the diffusion member provided at the bottom can reduce nonuniformity of intensity of light on the illuminated area.

Combinations of plural embodiments in those shown in FIGS. 15 to 18 can be other embodiments.

What is claimed is:

1. An illumination device comprising a planar light source and an optical element including a light receiving surface for receiving light from the planar light source and a light exiting surface, wherein a shape of the planar light source in a plane is symmetric with respect to x-axis and y-axis and length of the shape in x-axis direction is shorter than length of the shape in y-axis direction where the center of the planar light source is set as the origin and two axes orthogonal to each other are selected as x-axis and y-axis, and wherein the maximum value of x-coordinate of the planar light source is a, the maximum value of y-coordinate of the planar light source is b, the following relationship holds:

$b/a \geq 1.2$, and wherein the axis which passes through the origin and is perpendicular to the plane is selected as an optical axis, the x-axis and the y-axis being orthogonal to the optical axis, and the light receiving surface has a concaved shape, the top of the concaved shape being at the point of intersection between the light receiving surface and the optical axis and any cross section of the top of the concaved shape containing the optical axis being symmetric with respect to the optical axis, and wherein, in a cross section which contains the optical axis and the x-axis a distance between the light receiving surface and the plane at a point having x-coordinate of a or −a is $h_a$ and in a cross section which contains the optical axis and the y-axis a distance between the light receiving surface and the plane at a point having y-coordinate of b or −b is $h_b$, the following relationship holds:

$$\frac{(h_a + a) - (h_b + b)}{(h_a + a)} \leq 0.02.$$

2. An illumination device according to claim 1, wherein the light receiving surface is biconic.

3. An illumination device according to claim 1, wherein the center of the light exiting surface is defined as the point of intersection of the light exiting surface and the optical axis, and a diffusion member is provided around the center of the light exiting surface.

4. An illumination device according to claim 1, wherein the center of the light receiving surface is defined as the point of intersection of the light receiving surface and the optical axis, and a diffusion member is provided around the center of the light receiving surface.

5. An illumination device according to claim 1, wherein the center of the light exiting surface is defined as the point of intersection of the light exiting surface and the optical axis, an upper surface is defined as a surface containing the center of the light exiting surface, and a diffusion member is provided at the boundary between the upper surface and a side.

6. An illumination device according to claim 1, wherein a bottom is defined as a plane formed in x-y plane containing the origin, a diffusion member is provided on the bottom.

7. An optical element used for a planar light source and including a light receiving surface for receiving light from the planar light source and a light exiting surface, wherein a shape of the planar light source in a plane is symmetric with respect to x-axis and y-axis and length of the shape in x-axis direction is shorter than length of the shape in y-axis direction where the center of the planar light source is set as the origin and two axes orthogonal to each other are selected as x-axis and y-axis, and wherein the maximum value of x-coordinate of the planar light source is a, the maximum value of y-coordinate of the planar light source is b, the following relationship holds:

$b/a \geq 1.2$, and wherein the axis which passes through the origin and is perpendicular to the plane is selected as an optical axis, the x-axis and the y-axis being orthogonal to the optical axis, and the light receiving surface has a concaved shape, the top of the concaved shape being at the point of intersection between the light receiving surface and the optical axis and any cross section of the top of the concaved shape containing the optical axis being symmetric with respect to the optical axis, and wherein, in a cross section which contains the optical axis and the x-axis a distance between the light receiving surface and the plane at a point having x-coordinate of a or −a is $h_a$ and in a cross section which contains the optical axis and the y-axis a distance between the light receiving surface and the plane at a point having y-coordinate of b or −b is $h_b$, the following relationship holds:

$$\frac{(h_a + a) - (h_b + b)}{(h_a + a)} \leq 0.02.$$

* * * * *